United States Patent
Savolainen

(10) Patent No.: US 9,841,468 B2
(45) Date of Patent: Dec. 12, 2017

(54) METHOD FOR DETECTING FAILURE OF ENERGY HARVESTING DEVICE

(71) Applicant: Nokia Technologies Oy, Espoo (FI)

(72) Inventor: Teemu Savolainen, Nokia (FI)

(73) Assignee: Nokia Technologies Oy, Espoo (FI)

( * ) Notice: Subject to any disclaimer, the term of this patent is extended or adjusted under 35 U.S.C. 154(b) by 29 days.

(21) Appl. No.: 14/904,053

(22) PCT Filed: Jul. 24, 2013

(86) PCT No.: PCT/FI2013/050772
§ 371 (c)(1),
(2) Date: Jan. 8, 2016

(87) PCT Pub. No.: WO2015/011335
PCT Pub. Date: Jan. 29, 2015

(65) Prior Publication Data
US 2016/0161569 A1   Jun. 9, 2016

(51) Int. Cl.
*G01R 31/40* (2014.01)
*H02J 13/00* (2006.01)
*H02J 3/38* (2006.01)

(52) U.S. Cl.
CPC .......... *G01R 31/40* (2013.01); *H02J 13/0086* (2013.01); *H02J 3/383* (2013.01); *H02J 3/386* (2013.01); *Y02E 10/563* (2013.01); *Y02E 10/763* (2013.01); *Y02E 40/72* (2013.01); *Y04S 10/123* (2013.01)

(58) Field of Classification Search
CPC .......... G01R 31/40; H02J 3/383; H02J 3/386; Y04E 10/563; Y04E 10/763; Y04S 10/123
See application file for complete search history.

(56) References Cited

U.S. PATENT DOCUMENTS

| | | |
|---|---|---|
| 6,865,685 B2 | 3/2005 | Hammond et al. |
| 2002/0138775 A1 | 9/2002 | Hammond et al. |
| 2010/0070731 A1 | 3/2010 | Mizuno et al. |
| 2010/0271199 A1 | 10/2010 | Belov et al. |
| 2010/0318233 A1 | 12/2010 | Yunes et al. |
| 2011/0153036 A1 | 6/2011 | Colucci et al. |

(Continued)

FOREIGN PATENT DOCUMENTS

| | | |
|---|---|---|
| CN | 101162388 A | 4/2008 |
| CN | 101858312 A | 10/2010 |

(Continued)

OTHER PUBLICATIONS

International Search Report and Written Opinion received for corresponding Patent Cooperation Treaty Application No. PCT/FI2013/050772, dated Jan. 22, 2014, 12 pages.

(Continued)

*Primary Examiner* — Minh N Tang
(74) *Attorney, Agent, or Firm* — Ditthavong & Steiner, P.C.

(57) ABSTRACT

A method comprises obtaining information relating to an energy harvesting device from a secondary information source by a server comprising a mapping database, comparing the obtained information to the information in a mapping database by the server, and determining a state of the energy harvesting device as offline and operative.

20 Claims, 4 Drawing Sheets

(56) References Cited

U.S. PATENT DOCUMENTS

| | | | | |
|---|---|---|---|---|
| 2011/0264293 | A1* | 10/2011 | Forrest | H02J 7/0047 700/295 |
| 2012/0098645 | A1 | 4/2012 | Sheldon | |
| 2012/0136627 | A1* | 5/2012 | Jensen | G05B 23/0235 702/182 |
| 2012/0166363 | A1 | 6/2012 | He et al. | |
| 2012/0191351 | A1 | 7/2012 | Kerrigan et al. | |
| 2013/0229059 | A1 | 9/2013 | Baba et al. | |
| 2013/0264992 | A1* | 10/2013 | Geris | H02J 7/34 320/101 |
| 2014/0062664 | A1* | 3/2014 | Gudan | G06K 7/10207 340/10.1 |
| 2014/0183947 | A1* | 7/2014 | Chandler | H02J 9/061 307/23 |

FOREIGN PATENT DOCUMENTS

| | | |
|---|---|---|
| CN | 102352824 A | 2/2012 |
| CN | 102902245 A | 1/2013 |
| CN | 103138635 A | 6/2013 |
| WO | 2010093234 A2 | 8/2010 |
| WO | 2012/041323 A2 | 4/2012 |
| WO | 2012107927 A1 | 8/2012 |
| WO | 2013053014 A1 | 4/2013 |

OTHER PUBLICATIONS

"Energy Harvesting", Wikipedia, Retrieved on Apr. 7, 2017, Webpage available at : https://en.wikipedia.org/wiki/Energy_harvesting.

"Energy Harvesting Forum", Energyharvesting, Retrieved on Apr. 7, 2017, 2017, Webpage available at : http://www.energyharvesting.net/.

Dang et al., "QuARES: A Quality-Aware Renewable Energy-Driven Sensing Framework", Sustainable Computing: Informatics and Systems, vol. 2, No. 4, Dec. 2012. pp. 1-13.

Extended European Search Report received for corresponding European Patent Application No. 13889780.6, dated Feb. 9, 2017, 5 pages.

Office Action for corresponding Chinese Patent Application No. 20138007867.9, dated May 27, 2017, English Language Summary Included, 7 pages.

* cited by examiner

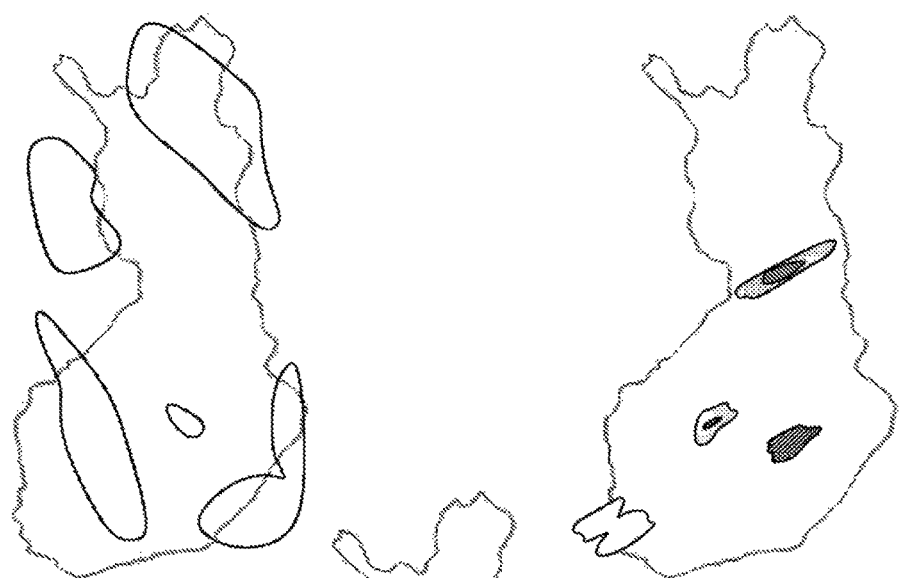
Fig. 4a
Fig. 4b
Fig. 4c
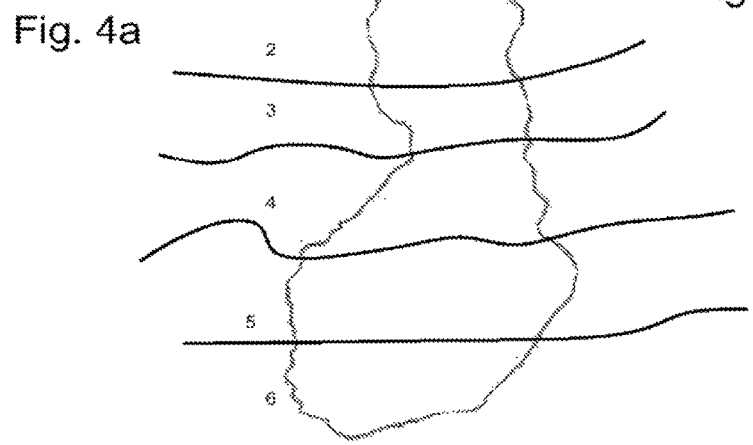
Fig. 4d

METHOD FOR DETECTING FAILURE OF ENERGY HARVESTING DEVICE

RELATED APPLICATION

This application was originally filed as Patent Cooperation Treaty Application No. PCT/FI2013/050772 filed Jul. 24, 2013.

BACKGROUND

Energy is everywhere in the environment and it is derivable from several natural sources in the form of thermal energy, solar energy, wind energy, and mechanical/kinetic energy. Energy harvesting is a process in which energy is derived from external sources, captured and stored, for example, for small, wireless autonomous i.e. self-powered devices, such as a variety of sensor and control circuitry, or energy harvesting can be used as an alternative energy source to supplement primary power and to enhance the reliability of the overall system and to prevent power interruptions.

When energy harvesting devices i.e. devices using energy which is captured from the environment and transformed into electrical energy, use energy harvesting as an only energy source it is possible that there are times when energy is not available or that the used energy source does not produce enough energy for powering the energy harvesting device. These conditions can cause problems for energy harvesting devices or systems using the energy harvesting devices.

SUMMARY

Now there has been invented an improved method and technical equipment implementing the method, by which monitoring of function of energy harvesting devices is more reliable. Various aspects of the invention include a method, a system, an apparatus, and a computer readable medium comprising a computer program stored therein, which are characterized by what is stated in the independent claims. Various embodiments of the invention are disclosed in the dependent claims.

According to a first aspect of the invention, there is provided a method for obtaining information relating to an energy harvesting device from a secondary information source by a server comprising a mapping database, comparing the obtained information to the information in the mapping database by the server and determining a default state of the energy harvesting device.

According to an embodiment, the server obtains the information from the secondary information source when the energy harvesting device has not established a connection between the server and the energy harvesting device within a predetermined time frame. According to an embodiment, the information relating to the energy harvesting device is information regarding environmental conditions of the energy harvesting device. According to an embodiment, the secondary information source comprises information relating to a power source of a sensor of the energy harvesting device. According to an embodiment, the method further comprises indicating that the energy harvesting device is failed, if the default state is determined to be online. According to an embodiment, the method further comprises: indicating that the energy harvesting device is operative, if the default state is determined to be offline. According to an embodiment, the mapping database is formed by collecting secondary information from one or more secondary information sources at points of time when the energy harvesting device had established a connection to the server. According to an embodiment, the secondary information source is a web page.

According to a second aspect of the invention, there is provided an apparatus comprising at least one processor, a memory including a computer program code, the memory and the computer program code configured, with the at least one processor, to cause the apparatus to perform at least the following: obtaining information relating to an energy harvesting device from a secondary information source by a server comprising a mapping database, comparing the obtained information to the information in the mapping database by the server and determining a default state of the energy harvesting device.

According to an embodiment, the apparatus obtains the information from the secondary information source when the energy harvesting device has not established a connection between the server and the energy harvesting device within a predetermined time frame. According to an embodiment, the information relating to the energy harvesting device is information regarding environmental conditions of the energy harvesting device. According to an embodiment, the secondary information source comprises information relating to a power source of a sensor of the energy harvesting device.

According to an embodiment, the apparatus further performs: indicating that the energy harvesting device is failed, if the default state is determined to be online. According to an embodiment, the apparatus further performs: indicating that the energy harvesting device is operative, if the default state is determined to be offline. According to an embodiment, the mapping database is formed by collecting secondary information from one or more secondary information sources at points of time when the energy harvesting device had established a connection to the server. According to an embodiment, the secondary information source is a web page.

According to a third aspect of the invention, there is provided a system comprising a server, at least one energy harvesting device and at least one secondary information source, wherein the server comprises a processor, a memory including a computer program code, the memory and the computer program code configured, with the at least one processor, to cause the system to perform at least the following: obtaining information relating to an energy harvesting device from a secondary information source by a server comprising a mapping database, comparing the obtained information to the information in the mapping database by the server and determining a default state of the energy harvesting device.

According to an embodiment, the server obtains the information from the secondary information source when the energy harvesting device has not established a connection between the server and the energy harvesting device within a predetermined time frame. According to an embodiment, the information relating to the energy harvesting device is information regarding environmental conditions of the energy harvesting device. According to an embodiment, the secondary information source comprises information relating to a power source of a sensor of the energy harvesting device. According to an embodiment, wherein the system further performs: indicating that the energy harvesting device is failed, if the default state is determined to be online. According to an embodiment, wherein the system further performs: indicating that the energy harvesting device is operative, if the default state is determined to be offline. According to an embodiment, the mapping database is formed by collecting secondary information from one or more secondary information sources at points of time when the energy harvesting device had established a connection to the server. According to an embodiment, the secondary information source is a web page.

According to a fourth aspect of the invention, there is provided an apparatus comprising: means for obtaining information relating to an energy harvesting device from a secondary information source by a server comprising a mapping database, means for comparing the obtained information to the information in the mapping database by the server and means for determining a default state of the energy harvesting device.

According to an embodiment, said means for obtaining the information obtains the information from the secondary information source when the energy harvesting device has not established a connection between the server and the energy harvesting device within a predetermined time frame. According to an embodiment, the information relating to the energy harvesting device is information regarding environmental conditions of the energy harvesting device. According to an embodiment, the secondary information source comprises information relating to a power source of a sensor of the energy harvesting device. According to an embodiment, the apparatus further comprises means for indicating that the energy harvesting device is failed, if the default state is determined to be online. According to an embodiment, the apparatus further comprises means for indicating that the energy harvesting device is operative, if the default state is determined to be offline. According to an embodiment, the mapping database is formed by collecting secondary information from one or more secondary information sources at points of time when the energy harvesting device had established a connection to the server. According to an embodiment, the secondary information source is a web page.

According to a fifth aspect of the invention, there is provided a computer program product embodied on a non-transitory computer readable medium, comprising a computer program code configured, when executed on at least one processor, to cause a system to obtain information relating to an energy harvesting device from a secondary information source by a server comprising a mapping database, when an energy harvesting device has not established a connection between the server and the energy harvesting device within a predetermined time frame, compare the obtained information to the information in the mapping database by the server and determine a default state of the energy harvesting device.

According to an embodiment, the server obtains information from the secondary information source when the energy harvesting device has not established a connection between the server and the energy harvesting device within a predetermined time frame. According to an embodiment, the information relating to the energy harvesting device is information regarding environmental conditions of the energy harvesting device. According to an embodiment, the secondary information source comprises information relating to a power source of a sensor of the energy harvesting device. According to an embodiment, the system further indicates that the energy harvesting device is failed, if the default state is determined to be online. According to an embodiment, the system further indicates that the energy harvesting device is operative, if the default state is determined to be offline. According to an embodiment, the mapping database is formed by collecting secondary information from one or more secondary information sources at points of time when the energy harvesting device had established a connection to the server. According to an embodiment, the secondary information source is a web page.

DESCRIPTION OF THE DRAWINGS

In the following, various embodiments of the invention will be described in more detail with reference to the appended drawings, in which

FIG. 4a-d show secondary information sources according to an example embodiment.

DESCRIPTION OF EXAMPLE EMBODIMENTS

Figure 1:
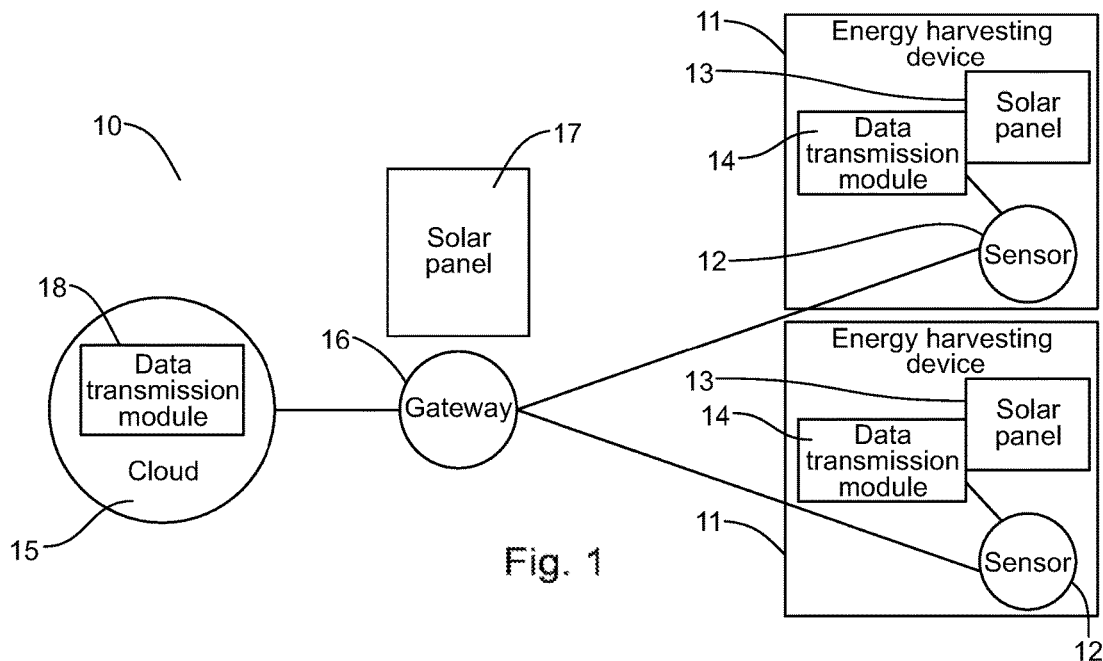
FIG. 1 shows an embodiment of the invention, in which a block diagram comprising basic parts of an energy harvesting system is disclosed.

In the following, several embodiments of the invention will be described in the context of energy harvesting systems comprising at least one energy harvesting device using environmental energy as an energy source. The energy harvesting system comprising at least one energy harvesting device may measure, for example, growth circumstances i.e. conditions of a garden, cultivated area, greenhouse, agricultural or forestry production area etc. The energy harvesting device may measure the amount of sunlight, moisture of the soil or air, soil acidity, temperature, wind, air pollution level, pressure, UV radiation or any other feature suitable to be measured from the growth area.

The energy harvesting device comprises, for example, a sensor or an actuator for measuring conditions, means for transmitting measurement readings (data) i.e. data transmission means and further means for powering the device i.e. powering means. The powering means, the sensor or actuator and data transmission means are electrically connected together. The energy harvesting device may be, for example, solar powered (light) or the energy harvesting device may receive energy from, for example, wind, heat, sea waves, motion etc. instead of light (sun). For example, if the energy harvesting device is solar powered, it may comprise a solar panel or if it is wind powered it may comprise a micro wind turbine as powering means. In addition, it is possible that the energy harvesting device uses two or more environmental power sources together. It may use, for example, both wind and light as its power sources.

It is to be noted, however, that the invention is not limited to energy harvesting systems relating to growth circumstances or systems comprising solar powered energy harvesting devices. In fact, the different embodiments have applications in any environment where a system collects data from energy harvesting devices.

In addition to at least one energy harvesting device, the energy harvesting system may further comprise a server and at least one secondary information source. The energy harvesting devices transmit measurement data to the server and the secondary information sources provide the server with information relating to an energy harvesting device and in particular the information relates to the environment of the energy harvesting devices. The secondary information source may be, for example, internet. Information relating to the environment of the energy harvesting device and provided by at least one secondary energy source may be, for example, temperature, wind, moisture, air pollution level, pressure, UV radiation, cloudiness etc. The server may be, for example, a Command and Control server for said sensors such as utility's C&C, or a cloud entity acting as a server for energy harvesting device/s. The server may further deliver information such as an energy harvesting device is failed or operative e.g. to an end user using a mobile handset. In the mobile device, there may also be, for example, an application accessing data in the server receiving information such as measurement data from the energy harvesting device. The secondary information source may be, for example, websites of weather forecast entities, for example, Ilmatieteenlaitos, Foreca, or METAR information.

An energy harvesting device is able to connect to a server of an energy harvesting system by data transmission means only when it is able to harvest enough energy from its surroundings i.e. in online state. Thus, the online state is a state, where the energy harvesting device should get enough power from its energy source so that the energy harvesting device could be connected to a server. Whereas, the offline state is a state, where the energy harvesting device does not get enough power from its energy source so that it could establish a connection to a server. So if the energy harvesting device is not connecting to the server i.e. is in offline state, it is desirable for the system to know whether the energy harvesting device is just unable to harvest energy from surrounding environment or whether the energy harvesting device is actually failed. Awareness of failure would allow quicker mitigation actions i.e. the system or people monitoring the energy harvesting device/system may call for maintenance. Further, if it can be deduced/determined on the base of the information of the secondary device that the energy harvesting device should be in offline state, which is so called reasonable offline state, e.g. due bad weather it may be useful for people monitoring and/or using the information from the energy harvesting device so that a gratuitous alarm for maintenance will not be done.

An energy harvesting device may be connected to a server when its energy source produces enough energy, and transmit information to the server. The information may comprise measurement data and/or location data of the energy harvesting device. The server may use the location data of the energy harvesting device to obtain information from a secondary information source. The energy harvesting device may transmit the location data or the location of the energy harvesting device may be predefined for the server. The location may be used, for example, to obtain weather information around/near by the energy harvesting device. The energy harvesting device may transmit information directly to a server or via a gateway. The server may then combine the measurement data with information received from a secondary information source or sources about a state of the energy source i.e. conditions around/near by the energy harvesting device.

Sometimes, it may be enough for the energy harvesting system and people monitoring the energy harvesting system just to create a connection between the energy harvesting device and the server without any data transmission as an indication to the server that in current conditions the energy harvesting device gets enough energy and/or that the energy harvesting device is operational.

When a server does not hear from an energy harvesting device i.e. if a short range connection is not established between the energy harvesting device and the server when a certain time has elapsed from previous connection, the server may obtain information i.e. hints about a default state from a secondary information source i.e. whether the energy harvesting device should or should not be receiving enough energy for operation. If there should be enough energy, but energy harvesting device does not communicate, a failure is likely to have occurred. The short range connection may be, for example, 802.15.4 connection, Bluetooth connection, or Bluetooth Low-Energy connection, or 802.11 WLAN connection, or any other short range connection suitable to be established between the energy harvesting device and the server. However, it may also be possible to establish a long range connection between the energy harvesting device and the server.

An advanced algorithm on a server may use machine learning/neural networks to collect (and store) secondary information from one or more secondary information sources at points of time when the energy harvesting device was in online state and establish a connection to the server to build a mapping database. That mapping data base may then be used for deciding a default state i.e. whether the energy harvesting device should be in online state or offline state. The mapping database may be, for example, in a form of a graph. Basically, the algorithm could learn from situations when the energy harvesting device has been able to gather enough energy to be online, and in the future, when similar situations occur, determine whether the energy harvesting device should be online or not. It is also possible that the server has received the mapping database from some other server.

An example embodiment of the present invention and its potential advantages are understood by referring to FIGS. 1 through 5 of the drawings.

FIG. 1 shows an embodiment of the invention, in which a block diagram comprising basic parts of an energy harvesting system is disclosed. The system of FIG. 1 shows a system 10, where energy harvesting devices 11 comprise sensors 12, solar panels 13 and data transmission modules 14. Energy harvesting devices 11 establish a connection between cloud 15 acting as a server and energy harvesting devices 11 via gateway 16. The energy harvesting devices 11 connect to gateway 16, for example, over a short range such as a 802.15.4 short range radio or a long range. The energy harvesting devices 11 transfer their measurement data comprising measurement readings and possibly further location data to the gateway 16. The gateway 16 establishes a connection between the gateway 16 and the cloud 15, for example, over a long or short range connection. The long range connection may be, for example, 3GPP cellular connection (2G (GPRS, EDGE)/3G (WCDMA)/G (LTE)/LTE Advanced), WiMAX connection, 802.11 WLAN connection, or any other long range connection suitable to be established between the gateway 16 and the cloud 15. The gateway 16 transfers information comprising data received from the energy harvesting devices 11 to the cloud 15, which collect measurement readings and location data. However, it is also possible that the energy harvesting devices 11 establish a connection directly to the cloud 15 or any other server. The gateway 16 is also solar powered and it comprises a solar panel 17. Also, the cloud 15 comprises a data transmission module 18.

In the embodiment of FIG. 1 the system 10 may have device problems that relate to failures of the gateway 16 and/or energy harvesting device/s 11 or energy problems that relate to the energy source. In case of device problems; the gateway 16 is failed and a connection cannot be established over a long range or the energy harvesting device 11 is failed and a connection cannot be established over a short range. In case of energy problems; the solar panel 17 of the gateway 16 and/or the solar panels 13 of energy harvesting device/s 11 do not get enough energy power to establish a connection. Thus, the gateway 16 is out of power and a connection to the cloud 13 cannot be established over a long range or the energy harvesting device 11 is out of power and connection to gateway 16 cannot be established over a short range.

Figure 2:
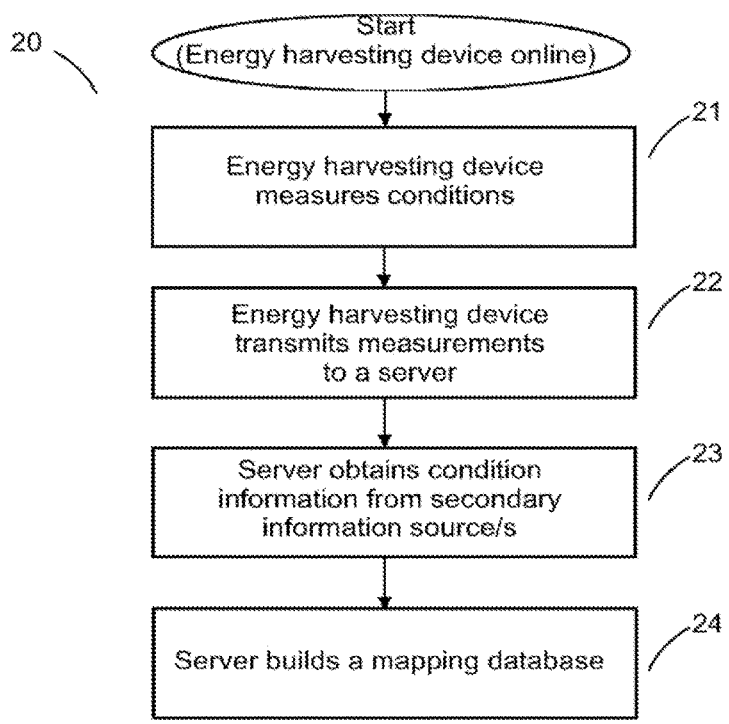
FIG. 2 shows a flow chart of a method of an energy harvesting system in online state according to an example embodiment.

FIG. 2 shows a flow chart of method 20 of an energy harvesting system, when an energy harvesting device receives enough energy i.e. at least one energy harvesting device is in online state according to an example embodiment. In step 21 the energy harvesting device measures at least one condition reading. In step 22 the energy harvesting device transmits measurement data i.e. at least one conditions reading to a server. In step 23 the server obtains condition information from at least one secondary information source. And in step 24 the server creates a mapping database. When creating the mapping database, the server may use an algorithm comprising machine learning or neural networks to collect secondary information from one or more secondary information sources at times of step 22. Thus, the mapping database comprises collected secondary information data in situations when the energy harvesting device has transmitted measurement data. Thus, when receiving secondary information, when energy harvesting device is offline, and comparing the secondary information at that moment to the mapping database, it may be possible to decide or at least evaluate whether the energy harvesting device should be online or not. The energy harvesting device may be arranged to transmit measurement data within predetermined time frames. The time frame may be a period of time within which the energy harvesting device should try to establish a connection to the server. The predetermined time frame may be a certain period of time when the energy harvesting device is expected to establish the connection, for example, after a previous connection or a time of a day. The predetermined time frame may also be a certain period of time after the server has polled the energy harvesting device. The length of the time frames may vary, they may be long, for example, several hours, or short, for example, a few minutes.

The system may comprise more than one energy harvesting device and one energy harvesting device may measure condition readings by one or more sensors/accumulators and further transmit those readings to the server. In addition, the server may request or automatically obtain condition information from more than one secondary information source. Therefore, it is possible that the system has, for example, two or more secondary information sources providing information that relates to the environmental condition of one energy harvesting device.

Figure 3:
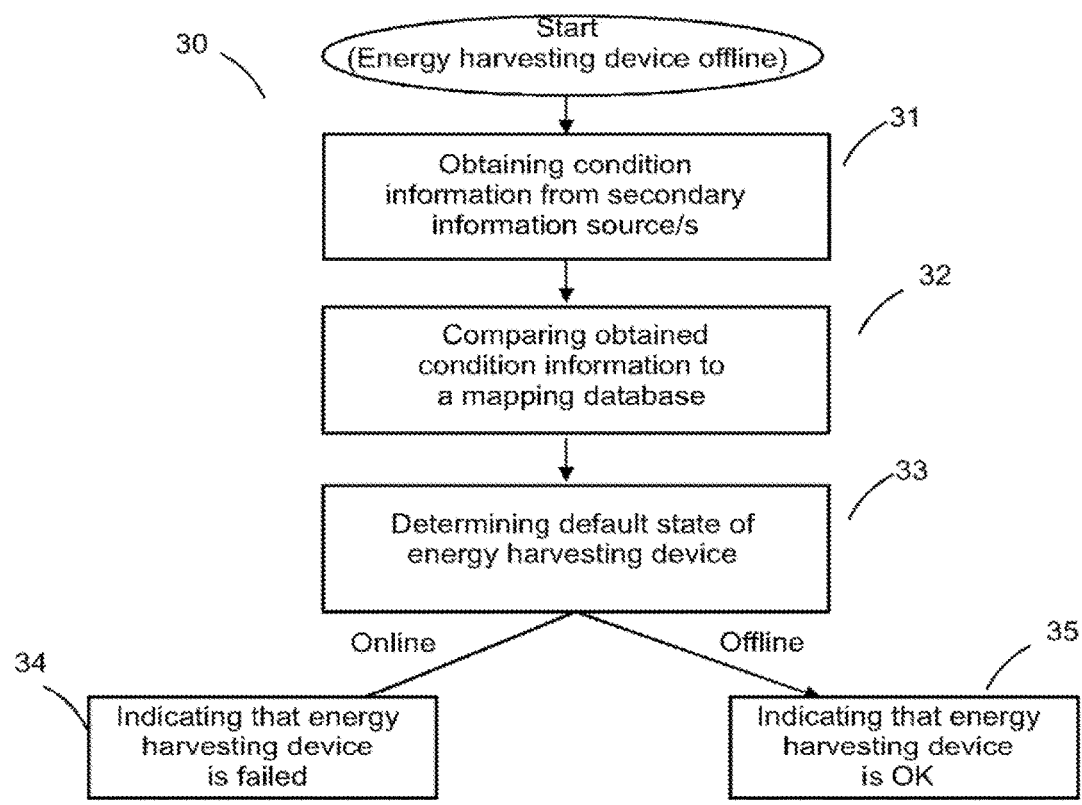
FIG. 3 shows a flow chart of a method of an energy harvesting system in offline state according to an example embodiment.

FIG. 3 shows a flow chart of method 30 of an energy harvesting system, when an energy harvesting device cannot receive enough energy i.e. the energy harvesting device is in offline state, according to an example embodiment. The energy harvesting device has not established a connection to a server within a predetermined time frame. In step 31 the server obtains condition information from secondary information source/s, wherein the condition information relates to area/environment around/nearby the energy harvesting device. In step 32 the server compares obtained condition information to a mapping database. In step 33 the server determines a default state of the energy harvesting device i.e. should the energy harvesting device be online or offline, on the base of comparison of step 32. If the server determines that the energy harvesting device should be online the method continues to step 34, wherein the server indicates that the energy harvesting device is failed. Whereas, if the server determines that the energy harvesting device should be offline the method continues to step 35, wherein the server indicates that the energy harvesting device is operative, which means that the energy harvesting device can establish a connection again when conditions are suitable e.g. enough sunlight.

FIGS. 4a-d show secondary information sources according to an example embodiment. Examples of secondary information sources help the server to determine a default state of an energy harvesting device. In FIG. 4a is shown a web page indicating cloudiness, in FIG. 4b is shown a web page indicating rain areas, in FIG. 4c is shown a web page indicating amounts of ultraviolet radiation and in 4d is shown a web page comprising a local web report indicating quantities of wind, temperature, moisture and air pressure. However, secondary information sources are not restricted to shown embodiments, on the contrary, secondary information sources may comprise any information that relates to the energy source of the current energy harvesting device.

Figure 5:
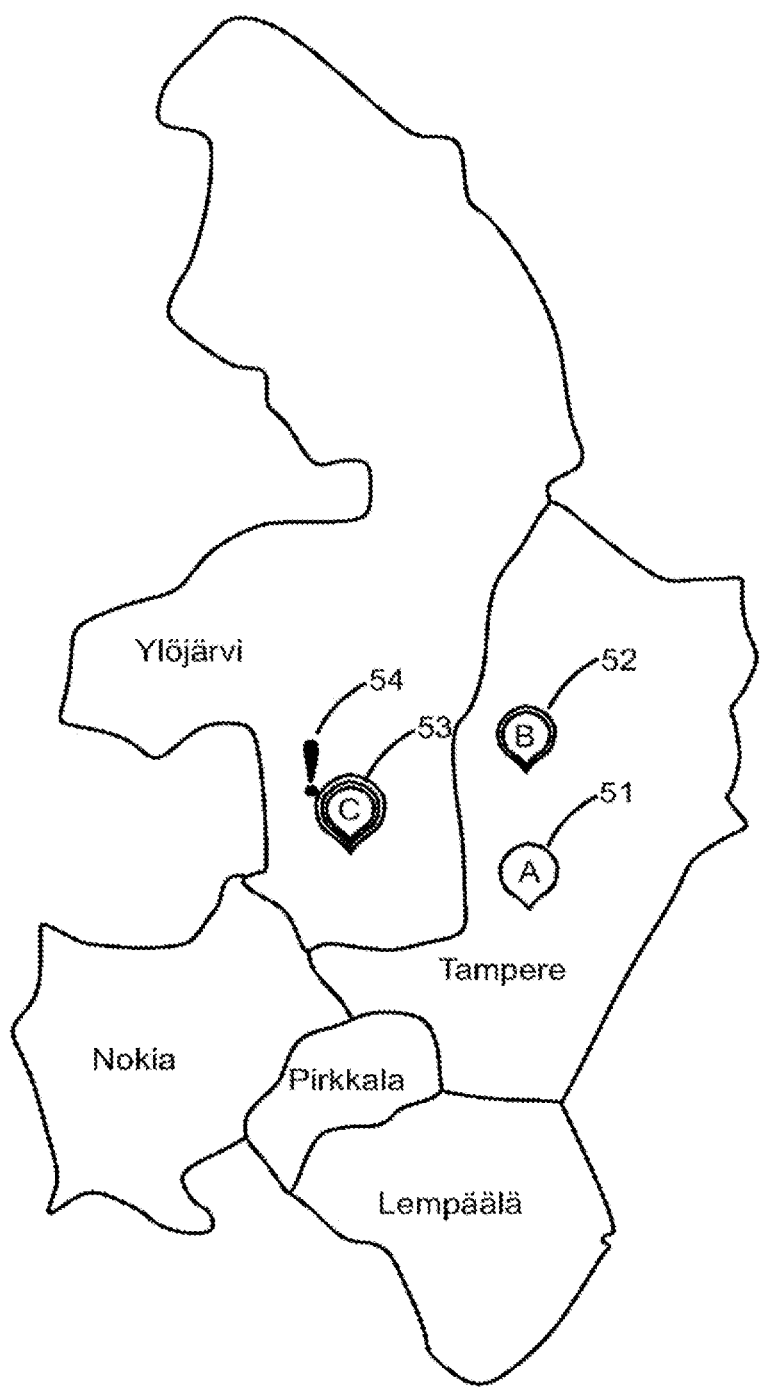
FIG. 5 shows a status presentation of energy harvesting devices of an energy harvesting system according to an example embodiment.

FIG. 5 shows a status presentation of energy harvesting devices of an energy harvesting system according to an example embodiment. Statuses of three energy harvesting devices are shown on a map 50. Energy harvesting device A 51 is working nominally, energy harvesting device B 52 is offline (in so called reasonable offline state) but that is expected from given conditions received from secondary information sources (not shown) (e.g. local cloud making shadow in that area) and hence shown differently than the energy harvesting device A 51, but energy harvesting device C 53 is offline without a good cause i.e. in so called failure state (e.g. it is all sunshine but no connectivity) and hence it is shown differently than the energy harvesting device B 52 also in offline state. Alarm is shown by an exclamation mark 54 for indicating possible sensor failure of the energy harvesting device C 53. Every state of the energy harvesting devices (online, (reasonable) offline, failure) may be shown differently for users of the energy harvesting system so that the states of energy harvesting devices can be easily seen. However, the shapes, sizes or colors of state indications are not restricted to shown embodiments or in any other way. In addition, it is possible to show the states of energy harvesting devices in a chart or directory or in any other suitable way.

The server stores as log files information from secondary information sources and energy harvesting device and/or gateways. The log files on may comprise, for example following information: whether a gateway or an energy harvesting device has been detected to be online or offline, date, time stamp, secondary information etc. On the base of those log files it may be possible to determine, for example, a default state of the gateway or the energy harvesting device, but also when (for example, time when it should be bright enough for solar cells) the gateway or the energy harvesting device should turn to online state.

The various embodiments of the invention can be implemented with the help of a computer program code that resides in a memory of a server and causes the server to carry out the invention. For example, a server may comprise circuitry and electronics for handling, receiving and transmitting data, a computer program code in a memory, and a processor that, when running the computer program code, causes the device to carry out the features of an embodiment. Yet further, the server may comprise circuitry and electronics for handling, receiving and transmitting data.

It is obvious that the present invention is not limited solely to the above-presented embodiments, but it can be modified within the scope of the appended claims.

The invention claimed is:

1. A method, comprising:
   receiving, by a server, measurement information and location information of an energy harvesting device when the energy harvesting device is connected to the server, wherein the energy harvesting device is a mobile device;
   at a time when the energy harvesting device has not connected to a server for a predetermined time period, obtaining, by the server, environmental condition information around the energy harvesting device from a secondary information source;
   mapping, by the server, a location of the energy harvesting device at the time to the environmental condition information; and
   determining, by the server, a state of the energy harvesting device as offline and operative when the environmental condition information is not suitable for the energy harvesting device to establish a connection to the server.

2. The method according to claim 1, wherein the energy harvesting device transfers the measurement information and the location information to the server via a short range connection.

3. The method according to claim 1, wherein the energy harvesting device is connected to the server via a gateway, and the connection between the energy harvesting device and the gateway is a short range connection.

4. The method according to claim 1, further comprising:
   determining, by the server, a state of the energy harvesting device as offline and failed when the environmental condition information is suitable for the energy harvesting device to establish a connection to the server, wherein the secondary information source comprises information relating to a power source of a sensor of the energy harvesting device.

5. The method according to claim 4, wherein the method further comprises:
   initiating, by the server, a maintenance action for the energy harvesting device determined as offline and failed.

6. The method according to claim 1, wherein a mapping database is formed by collecting secondary information from one or more secondary information sources at points of time when the energy harvesting device had established a connection to the server.

7. The method according to claim 1, wherein the energy harvesting device functions as a gateway that contacts another energy harvesting device to the server, and the connection between the energy harvesting device and the another energy harvesting device is a short range connection.

8. The method according to claim 7, further comprising:
   at another time when the gateway has not connected to the server for a predetermined time period, obtaining, by the server, environmental condition information around the gateway from the secondary information source;
   mapping, by the server, a location of the gateway at the another time to the environmental condition information;
   determining, by the server, a state of the gateway as offline and operative when the environmental condition information is not suitable for the gateway to establish a connection to the server; and
   determining, by the server, a state of the gateway as offline and failed when the environmental condition information is suitable for the gateway to establish a connection to the server.

9. An apparatus comprising;
   at least one processor, and
   at least one memory including a computer program code,
   the at least one memory and the computer program code configured, with the at least one processor, to cause the apparatus embedded in a server to perform at least the following,
   receive measurement information and location information of an energy harvesting device when the energy harvesting device is connected to the server, wherein the energy harvesting device is a mobile device;
   at a time when the energy harvesting device has not connected to a server for a predetermined time period, obtain environmental condition information around the energy harvesting device from a secondary information source;
   map a location of the energy harvesting device at the time to the environmental condition information; and
   determine a state of the energy harvesting device as offline and operative when the environmental condition information is not suitable for the energy harvesting device to establish a connection to the server.

10. The apparatus according to claim 9, wherein the energy harvesting device transfers the measurement information and the location information to the server via a short range connection.

11. The apparatus according to claim 9, wherein the energy harvesting device is connected to the server via a gateway, and the connection between the energy harvesting device and the gateway is a short range connection.

12. The apparatus according to claim 9, wherein the apparatus is further caused to:
   determine a state of the energy harvesting device as offline and failed when the environmental condition information is suitable for the energy harvesting device to establish a connection to the server,
   wherein the secondary information source comprises information relating to a power source of a sensor of the energy harvesting device.

13. The apparatus according to claim 12, wherein the apparatus further performs:
   initiate a maintenance action for the energy harvesting device determined as offline and failed.

14. The apparatus according to claim 9, wherein a mapping database is formed by collecting secondary information from one or more secondary information sources at points of time when the energy harvesting device had established a connection to the server.

15. A system comprising a server, at least one energy harvesting device and at least one secondary information source, wherein the server comprises a processor, a memory including a computer program code, the memory and the computer program code configured, with the processor, to cause the server to perform at least the following:
   receive measurement information and location information of an energy harvesting device when the energy harvesting device is connected to the server, wherein the energy harvesting device is a mobile device;

at a time when the energy harvesting device has not connected to a server for a predetermined time period, obtain environmental condition information around the energy harvesting device from a secondary information source;

map a location of the energy harvesting device at the time to the environmental condition information; and determine a state of the energy harvesting device as offline and operative when the environmental condition information is not suitable for the energy harvesting device to establish a connection to the server.

16. The system according to claim 15, wherein the energy harvesting device transfers the measurement information and the location information to the server via a short range connection.

17. The system according to claim 15, wherein the energy harvesting device is connected to the server via a gateway, and the connection between the energy harvesting device and the gateway is a short range connection.

18. The system according to claim 15, wherein the server is further caused to:

determine a state of the energy harvesting device as offline and failed when the environmental condition information is suitable for the energy harvesting device to establish a connection to the server, wherein the secondary information source comprises information relating to a power source of a sensor of the energy harvesting device.

19. The system according to claim 18, wherein the system further performs:

initiate a maintenance action for the energy harvesting device determined as offline and failed.

20. The system according to claim 15, wherein a mapping database is formed by collecting secondary information from one or more secondary information sources at points of time when the energy harvesting device had established a connection to the server.

* * * * *